(12) United States Patent
Tell et al.

(10) Patent No.: US 7,817,767 B2
(45) Date of Patent: Oct. 19, 2010

(54) PROCESSOR-CONTROLLED CLOCK-DATA RECOVERY

(75) Inventors: Stephen G. Tell, Chapel Hill, NC (US); Thomas H. Greer, III, Chapel Hill, NC (US)

(73) Assignee: Rambus Inc., Los Altos, CA (US)

( * ) Notice: Subject to any disclaimer, the term of this patent is extended or adjusted under 35 U.S.C. 154(b) by 1319 days.

(21) Appl. No.: 11/021,975

(22) Filed: Dec. 23, 2004

(65) Prior Publication Data

US 2006/0140321 A1   Jun. 29, 2006

(51) Int. Cl.
*H03D 3/24* (2006.01)

(52) U.S. Cl. .................. 375/376; 375/236; 375/294; 375/327; 375/331; 375/373

(58) Field of Classification Search .............. 375/376, 375/236, 294, 327, 331, 373
See application file for complete search history.

(56) References Cited

U.S. PATENT DOCUMENTS

| | | | |
|---|---|---|---|
| 5,463,351 A * | 10/1995 | Marko et al. ............... 331/1 A |
| 5,477,177 A * | 12/1995 | Wong et al. ................. 327/156 |
| 5,852,630 A * | 12/1998 | Langberg et al. ............ 375/219 |
| 2002/0180498 A1* | 12/2002 | O'Leary et al. ............. 327/156 |
| 2003/0212930 A1 | 11/2003 | Kohira et al. |
| 2004/0062332 A1 | 4/2004 | Dabral et al. |
| 2004/0170244 A1 | 9/2004 | Cranford, Jr. et al. |
| 2004/0212416 A1 | 10/2004 | Buchwall et al. |

OTHER PUBLICATIONS

International Search Report and Written Opinion of the International Searching Authority in International Application PCT/US2005/044076, World Intellectual Property Organization, Apr. 7, 2006, 15 pgs.
Foley et al., "Computer Graphics, Principles and Practice, Second Edition," Addison Wesley, 1990, pp. 72-78.
Velio Communications, Inc., "VC106X, VC105X 10-bit Redundant Quad or 5-bit Octal SerDes with 2 Reference Clocks for 0.9-3.2 Gbps 8b/10b Based Backplane, 1GE, 1G/2G FC, 10 GE, 10 GFC, IB Port Applications", Preliminary Product Datasheet, Jul. 12, 2002, Revision 1.745.
Velio Communications, Inc., "VC8000 (VSSO—Velio Super Solano) 36×36 Multi-rate Packet Switch 1.25, 1.5625, & 3.125 Gbps", May 21, 2003, Document Revision 1.3.
Wikipedia, "Bresenham's Line Algorithm", Wikipedia, Retrieved from URL: http://en.wikipedia.org/wiki/Bresenham%27s_line_algorithm on Dec. 7, 2004.

* cited by examiner

*Primary Examiner*—Shuwang Liu
*Assistant Examiner*—Kabir A Timory
(74) *Attorney, Agent, or Firm*—Mahamedi Paradice Kreisman LLP

(57) ABSTRACT

A processor-controlled clock-data recovery (CDR) system. Phase error signals having either a first state or a second state are generated within the CDR system according to whether a first clock signal leads or lags transitions of a data signal. A difference value is generated based on the phase error signals, the difference value indicating a difference between the number of the phase error signals having the first state and a number of the phase error signals having the second state. The difference value is transferred to a processor which is programmed to determine whether the difference value exceeds a first threshold and, if so, to adjust the phase of the first clock signal.

46 Claims, 7 Drawing Sheets

```
100  Loop
110    Read Saturating Counter Value, V
120    If (V > Thresh+) {
130      Increment PhaseCntrl
140      If (FreqCnt == FreqCntMax)
150        Increment FreqDiff
160      Increment FreqCnt }
170    If (V < Thresh-) {
180      Decrement PhaseCntrl
190      If (FreqCnt == 0)
200        Decrement FreqDiff
210      Decrement FreqCnt }
220    Slope = FreqDiff / LoopInvocationRate
230    Delta = Delta + Slope
240    Step = 0
250    if (Delta >= 1)
260      Step = 1
270    If (Delta <= -1)
280      Step = -1
290    Delta = Delta - Step
300    PhaseCntrl = PhaseCntrl + Step
310    Write MSBs of PhaseCntrl to Phase Control Register
320  EndLoop
```

FIG. 11

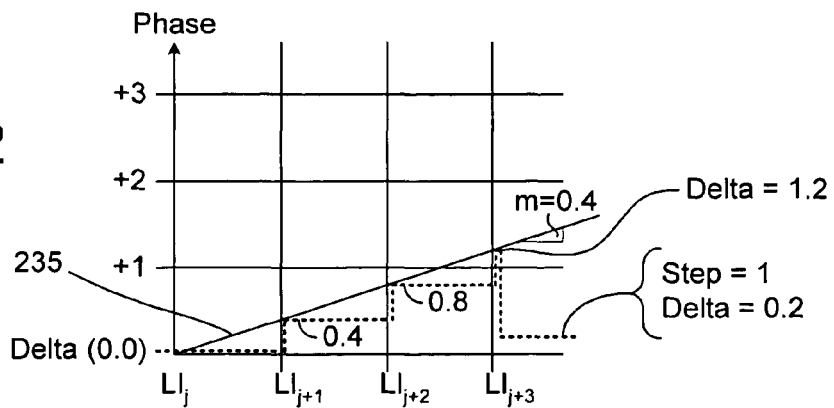

FIG. 12

PROCESSOR-CONTROLLED CLOCK-DATA RECOVERY

FIELD OF THE INVENTION

The present invention relates to the field of high-speed signaling.

BACKGROUND

A conventional digital clock-data recovery (CDR) system consists of circuitry for collecting timing information from an incoming data signal, processing and filtering the timing information to generate clock phasing information, and generating clock signals in accordance with the clock phasing information. Timing information is typically generated by determining whether samples captured in the vicinity of data signal transitions are captured before or after such transitions, thereby yielding a sequence of early/late indications at a peak rate equal to the data rate of the incoming signal. The early/late indications are typically provided to an up/down counter in which the most significant bits constitute a phase count that controls the phase of the recovered clock signals, and the least significant bits constitute a divider-type filter. That is, when the least significant bits overflow or underflow the phase count is incremented or decremented to adjust the phase of the recovered clock signals, thus effecting a divide-by-Q filter in which Q is established by the number of filter bits, R (i.e., $Q=2^R$).

In a plesiochronous system in which clock phases are updated relatively frequently to compensate for a frequency difference between reference clocks provided to the signal transmitter and receiver, a fairly small circuit block may be used to implement the divider-type filter. That is, a filter having a relatively short time-constant is desired, so that a low value of Q and therefore a small number of bits, R, may be used to implement the divider-type filter. By contrast, in a mesochronous system in which the receiver and transmitter receive reference clock signals having exactly the same frequency, but unknown phase, a much lower rate of phase updates is usually desirable, meaning that the value of Q and therefore the number of bits, R, used to implement the divider-type filter go up significantly. For example, at Gigahertz signaling rates, a CDR system may require a divider-type filter large enough to count several thousand early/late indications in order to realize a desired phase update frequency. Unfortunately, such large divider-type filters generally require a substantial amount of combinatorial logic and therefore tend to consume considerable power and die area; a consumption that may be multiplied many times over depending on the number of CDR-based signaling links in the device or system.

BRIEF DESCRIPTION OF THE DRAWINGS

The present invention is illustrated by way of example, and not by way of limitation, in the figures of the accompanying drawings and in which like reference numerals refer to similar elements and in which:

FIG. 11 illustrates an exemplary pseudo-code listing that may be executed by a processor to perform both phase and frequency update operations in the CDR systems of FIGS. 1 and 6;

FIG. 12 is a phase-time plot illustrating a clock frequency difference that may be determined and accounted for by the processor-controlled CDR system of FIGS. 1 and 7;

DETAILED DESCRIPTION

Figure 1:
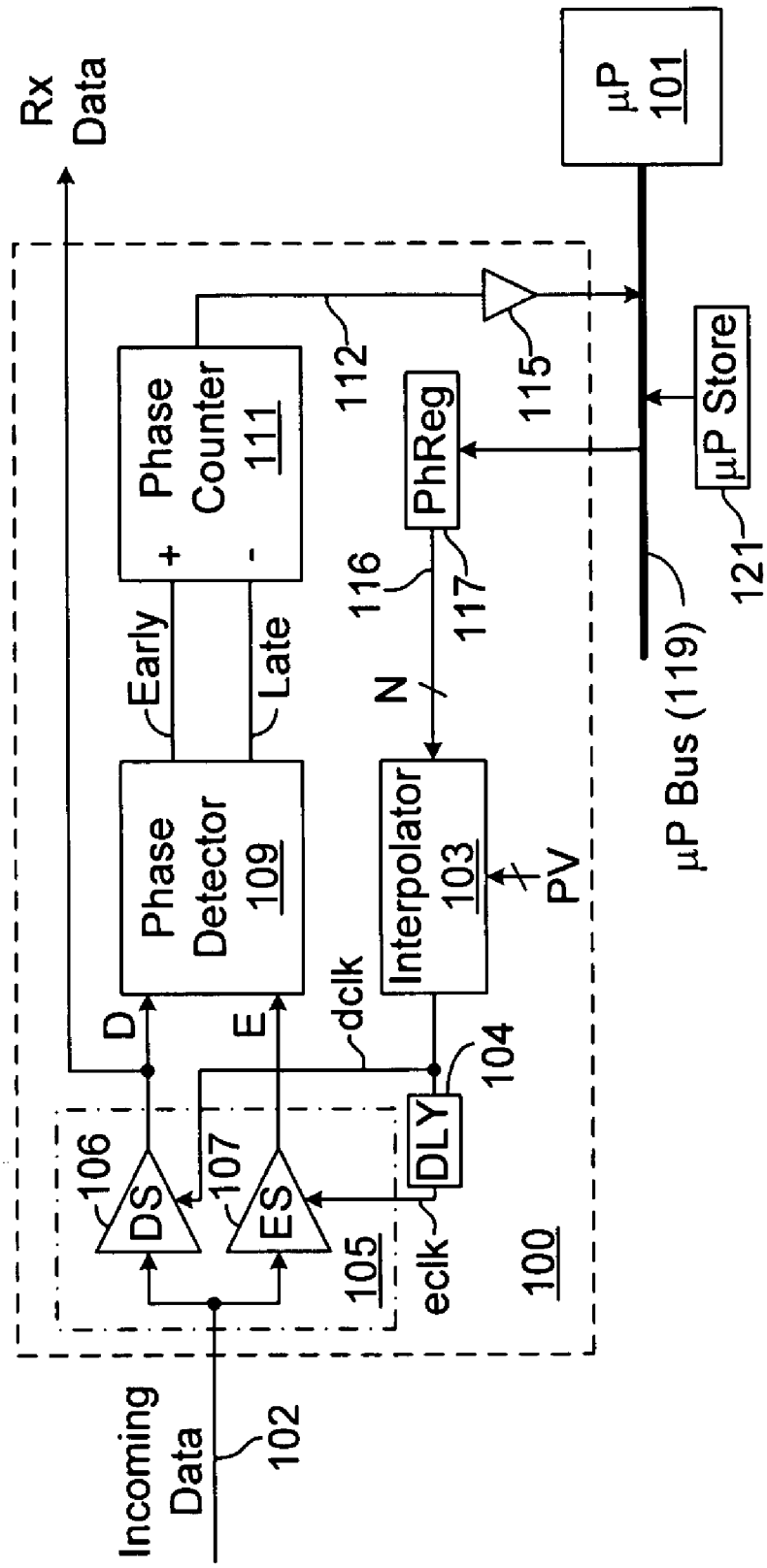
FIG. 1 illustrates an embodiment of a clock-data recovery (CDR) system having a processor-controlled phase update loop.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "exemplary" is used herein to express an example, and not a preference or requirement.

A clock-data recovery (CDR) system having a processor-controlled phase-update loop is disclosed in various embodiments. In one embodiment, the CDR system includes a phase counter that generates a differential count value in response to phase error signals generated by a phase detector. The phase error signals indicate whether a set of sampling clock signals supplied to an edge/data sampling circuit lead or lag desired sampling points in an incoming data signal, and the differential count value (i.e., a difference count) indicates whether more of the phase error signals indicate the leading condition or the lagging condition. The differential count value is read from time to time by a processor and compared, within the processor, against upper and lower threshold values. If the differential count value exceeds either threshold (i.e., exceeds the upper threshold or falls below the lower threshold), the processor updates a phase control variable, then writes the updated phase control variable into a phase control register that is used to control the phase of the sampling clock signals. Thus, by writing the updated phase control variable into the phase control register, the processor effectively adjusts the phase of the sampling clock signals, closing a negative feedback loop. In an alternative embodiment, the processor may adjust the phase of the sampling clock signals by outputting one or more signals to increment or decrement the phase control value within the phase control register instead of overwriting the content of a phase control register. The processor may be formed on the same integrated circuit die as the phase counter, edge/data sampling circuit and phase control register (i.e., an on-chip processor) or may be formed on a separate integrated circuit die in the same or different integrated circuit package. Also, the processor may service multiple CDR systems within a given integrated circuit device or set of integrated circuit devices.

In one embodiment, the phase counter is a saturating counter that counts up in response to phase error signals indicating the leading condition (early signals) and down in response to phase error signals indicating the lagging condition (late signals). Because a saturating counter does not overflow or underflow (i.e., does not rollover as a modulo counter does), a phase counter having a relatively small count range may be used to count early and late signals over an extended time interval without loss of information due to rollover. Consequently, the processor may read the phase counter relatively infrequently to establish a long-time-constant phase update rate (e.g., as may be desired in a mesochronous signaling system), yet still obtain valid phase update information.

In another embodiment, the phase counter may be run-time or production-time configured for either saturating or modulo counting operation to support both plesiochronous and mesochronous clock recovery modes within the CDR system. In the plesiochronous recovery mode, the phase counter is configured for modulo counting operation, with the least-significant bits (LSBs) of the phase counter effecting a divider-type filter and the most significant bits (MSBs) of the phase counter forming a phase control value. In the mesochronous recovery mode, the phase counter is configured for saturating counting operation and is polled by a processor which, in turn, conditionally updates a phase control register. The phase control register and most significant bits of the phase counter are alternately selected to control the phase of the sampling clock signals according to whether the CDR system is operating in the mesochronous recovery mode or plesiochronous recovery mode.

In yet other embodiments, the processor is used to estimate a frequency difference between a transmit clock (i.e., used to generate an incoming data signal) and the sampling clock signals. The estimated frequency difference may be supplied to a frequency pulse generator that outputs phase-adjust pulses at periodic or substantially periodic rate to compensate for the frequency difference. Alternatively, the estimated frequency difference may be used by the processor to update a phase control register as necessary to compensate for the frequency difference and to achieve a desired sampling clock phase. These and other embodiments are described in further detail below.

FIG. 1 illustrates an embodiment of a CDR system 100 having a processor-controlled phase update loop. The CDR system 100 includes a data-edge sampling circuit 105, phase detector 109, phase counter 111, output buffer 115, phase control register 117, interpolator 103 and delay element 104. A processor 101 is coupled to phase control register 117 and output buffer 115 via a processor bus 119. A non-volatile program storage 121 (e.g., a read only memory (ROM), programmable read only memory (PROM), electrically erasable programmable read only memory (EEPROM), flash EEPROM, battery backed memory or other non-volatile storage) may additionally be coupled to the processor bus 119 to store programming code and/or data for the processor 101. The program storage 121 may alternatively be a volatile storage that is loaded with program code and/or data during system run-time (e.g., during system start-up), and may be coupled to the processor 101 via a different bus or direct connection. The program storage 121 may also be embedded within or otherwise form part of the processor 101. The processor 101 and/or program storage 121 may be formed on the same integrated circuit die as the CDR system 100 (i.e., an on-chip processor) or on a separate integrated circuit die (i.e., an off-chip processor) and, in either case, may be deemed to be part of or distinct from the CDR system 100.

The interpolator 103 receives a set of phase vectors (PV) from a clock generator (e.g., a phase-locked loop, delay-locked loop or other clock source, not specifically shown) and interpolates between a selected pair of the phase vectors to generate a data-sampling clock signal referred to herein as a data clock (dclk). The pair of phase vectors selected by the interpolator and the interpolation between the phase vectors is controlled by a phase control value 116 stored within the phase control register 117. For example, in one embodiment, the phase control value 116 is an N-bit value having a K-bit vector-select field and a J-bit interpolation control field, N, K and J being integer values. The vector-select field is used to select one of K pairs of phase vectors that corresponds to one of K phase sectors (i.e., a phase angle extending over a distinct 360°/K range of a phase plot), and the interpolation control field is used to interpolate between the selected pair of phase vectors. As an example, in a particular embodiment, the phase control value 116 is a 9-bit value having a 3-bit vector select field to select between one of eight pairs of phase vectors that correspond to respective octants of a 360° phase plot, and a 6-bit interpolation control field (ICF) to enable generation of a phase vector that falls between the selected pair of phase vectors at an offset given by: leading phase vector+(ICF*45°)/64 (different numbers of bits may be included in the vector-select field and interpolation control field in alternative embodiments). By this arrangement, when the interpolation control field is zero, the data clock signal is generated with a phase that matches the phase of the leading phase vector. When the interpolation control field is 63 (i.e., the maximum value in for the exemplary 6-bit field), the data clock signal is generated with a phase that is delayed relative to the phase of the leading phase vector by (63*45°)/64; a phase angle that leads the trailing phase vector of the selected vector pair by one phase step. Thereafter, if the phase control value 116 is incremented to further delay the phase of the data clock signal, the interpolation control field rolls over to zero and the vector-select field is incremented to select a pair of phase vectors that bound the next octant of the phase plot. Note that different numbers of bits may be used within the interpolation control and vector-select fields of the phase control value The data clock signal is supplied to the data-edge sampling circuit 105 and also to the delay element 104. The delay element delays the data clock signal by a predetermined phase angle that nominally corresponds to a phase offset between a midpoint and edge of a data eye in an incoming data signal 102 (i.e., data eye referring to a data valid interval in the signal 102), and thus outputs a delayed sampling clock signal referred to herein as an edge clock signal (eclk). For example, in a double-data-rate system in which two data eyes are received per cycle of the data clock signal (a time interval referred to herein as a reference cycle), the phase offset between the midpoint and edge of a given data eye is one-fourth of the reference cycle, or 90°. Consequently, by constructing and/or controlling the delay element 104 to provide a 90° delay, the data clock signal and edge clock signal are offset from one another by a time interval that corresponds to the expected phase offset between edges and midpoints of incoming data eyes. A 90° phase offset between edge and data clock signals is assumed in the embodiment of FIG. 1 and embodiments described below, but different phase offsets may be used in alternative embodiments, for example, to support quad data rates (i.e., four data eyes per reference cycle), octal data rates, decade data rates or any other data rate). Also, the delay element 104 may be omitted in alternative embodiments and the edge clock signal generated directly by the interpolator 103. For example, the interpolator may generate the edge clock signal by interpolating between a pair of phase vectors that are offset by 90° (or other phase angle) from the phase vectors used to generate the data clock signal.

Figure 2:
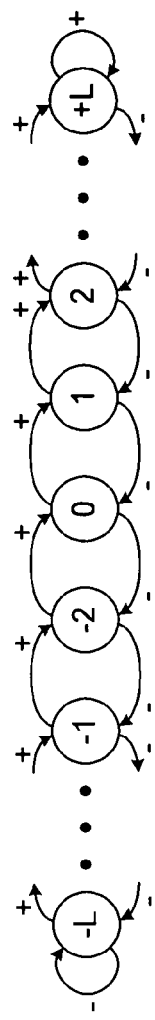
FIG. 2 is a timing diagram that illustrates capture of edge and data samples in response to transitions of differential edge and data clock signals.
Figure 3:
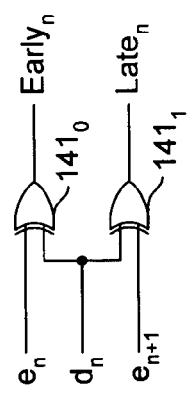
FIG. 3 illustrates an embodiment of a phase detector that may be used to implement the phase detector of FIG. 1.

The data-edge sampling circuit 105 includes a data sampler 106 (DS) and edge sampler 107 (ES) to generate samples of the incoming data signal 102 in response to transitions of the data clock signal and edge clock signal, respectively. In one embodiment, a negative feedback loop effected by the CDR system 100 drives the edge clock signal toward phase alignment with transitions in the incoming data signal 102 so that the data clock signal is aligned with midpoints in the incoming data eyes. By this arrangement, the data sampler 106 captures a sequence of data samples (D) in response to transitions of the data clock signal and the edge sampler 107 captures a sequence of edge samples (E) in response to transitions of the edge clock signal. The data and edge samples are output to the phase detector 109 which compares the samples to determine when transitions of the data signal 102 have occurred and whether the edge sample captured at the data signal transition was captured before or after the data signal crossed a mid-level threshold (i.e., a decision threshold used to distinguish between the digital value of the data and edge samples). Referring to FIG. 2, for example, differential edge and data clock signals are used to capture two edge samples ($e_n$, $e_{n+1}$) and two data samples ($d_n$, $d_{n+1}$) per reference cycle. That is, a first data sample, $d_n$, is captured at the midpoint of a first data eye 135a in response to a transition of the data clock signal, and second data sample, $d_{n+1}$, is captured at the midpoint of a second data eye 135b in response to a transition of the complement data clock signal (/dclk). Similarly, a first edge sample, $e_n$, is captured at the opening edge of the first data eye 135a (i.e., as the data signal 102 transitions from high to low or low to high), and a second edge sample, $e_{n+1}$, is captured at the closing edge of the first data eye 135a, the opening edge of the second data eye 135b. In one embodiment, shown in FIG. 3, the phase detector 109 of FIG. 1 includes a compare circuit, formed by exclusive-OR logic gates $141_0$ and $141_1$, to compare each data sample with the immediately preceding and subsequent (succeeding) edge samples. If the data sample does not match the preceding edge sample (i.e., $d_n \neq e_n$), then the output of exclusive-OR gate $141_0$ goes high to indicate that a data signal transition occurred between the edge and data sampling instants, and that the edge sample was captured early; before the data signal crossed the mid-level threshold. Accordingly, the output of exclusive-OR gate $141_0$ constitutes a phase error signal, referred to herein as an early signal, which indicates that the edge clock signal leads the data signal transition. If the data sample does not match the subsequent edge sample (i.e., $d_n \neq e_{n+1}$), then the output of exclusive-OR gate $141_1$ goes high to indicate that a data signal transition occurred between the data and edge sampling instants, and that the edge sample was captured late; after the data signal crossed the mid-level threshold. Accordingly, the output of exclusive-OR gate $141_1$ constitutes a phase error signal, referred to herein as a late signal, which indicates that the edge clock signal lags the data signal transition. Although not specifically shown in FIG. 3, the phase detector 109 of FIG. 1 may include additional exclusive-OR gates 141 to compare data sample $d_{n+1}$ with its preceding and succeeding edge samples to generate corresponding early/late indications.

Figure 4:
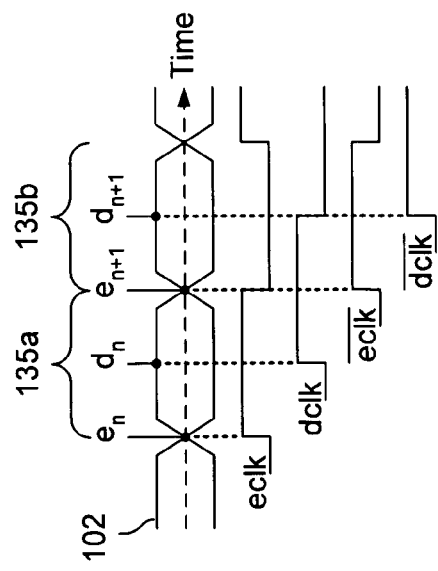
FIG. 4 illustrates an exemplary state diagram of the saturating phase counter of FIG. 1.

Returning to FIG. 1, the early signals and late signals (referred to collectively herein as early/late indications) generated by the phase detector 109 are supplied to count-up and count-down inputs, respectively, of the phase counter 111. By this arrangement, the phase count 112 maintained by the phase counter 111 represents a difference between the number of early signals and the number of late signals detected by the phase detector 109 and thus constitutes a difference count. In one embodiment, the phase counter 111 is a saturating counter having the exemplary state diagram illustrated in FIG. 4. That is, the phase counter 111 counts incrementally up or down in response to early (+) and late (−) signals toward upper and lower limits, +L and −L, respectively, but does not overflow or underflow (i.e., does not rollover) at either limit. Through this saturating operation, a relatively small count-range phase counter may be used to count early/late indications over an extended time interval without rollover-induced loss of phase information. For example, in one embodiment, the phase counter 111 is an 8-bit counter (count range=$2^8$) that is used to count early/late indications generated at gigahertz rates, but is inspected for phase update purposes at megahertz rates (i.e., after thousands of early/late indications may been received). By contrast, if a modulo counter (counter that underflows or overflows, rolling over from a maximum to a minimum value and vice-versa) was used to implement the phase counter 111, the counter might rollover one or more times between inspections, so that any inspection rate (i.e., rate at which the count value is inspected for phase update purposes) slow enough to allow the counter to exceed the count range between inspections may produce in an indeterminate phase update indication (i.e., recipient may be unable to determine if rollover occurred or not).

The processor 101 reads the phase count 112 from time to time by issuing an output enable signal to the output buffer 115, enabling the output buffer 115 to drive the phase count 112 onto the processor bus 119 so that it may be received into an internal register of the processor 101. The processor 101 is programmed to evaluate the phase count 112 and then conditionally update the phase control value 116 within the phase control register 117 to effect a phase adjustment of the sampling clock signals. Thus, the phase detector 109, phase counter 111 and processor-updated phase control register 117 cooperate to form a negative feedback loop that adjusts the phase of the sampling clock signals in a direction that cancels a phase error between the edge clock signal and transitions in the incoming data signal 102.

Figure 5:
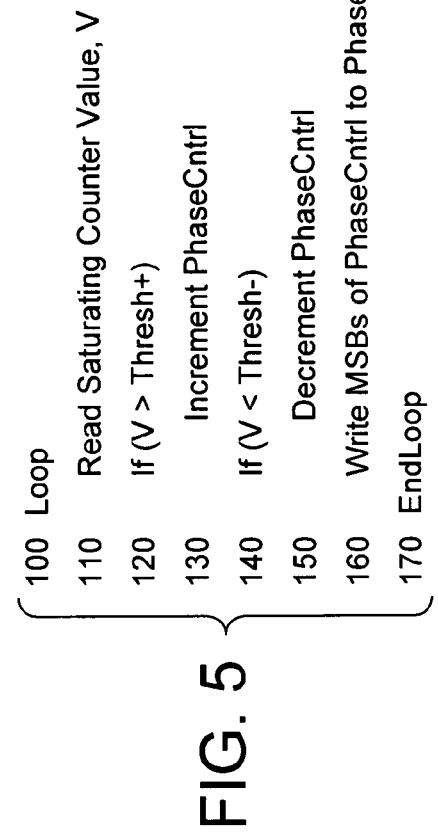
FIG. 5 illustrates an exemplary pseudo-code listing that may be executed by a processor to perform phase update operations in the CDR system of FIG. 1.

FIG. 5 illustrates an exemplary pseudo-code listing that may be executed by a processor to perform phase update operations in the CDR system of FIG. 1. In practice, the pseudo-code listing may be embodied by a sequence of instructions stored together with associated operands and/or data in the program store 121 of FIG. 1. The line numbers shown in connection with individual pseudo-code statements are provided for convenience of reference only and should not be construed as requiring the processor to be programmed in a particular programming language or as having a particular instruction set. Pseudo-code lines 100 and 170 (Loop, End-Loop) mark the beginning and end of a phase update loop that may be repeated indefinitely or exited in response to certain conditions. At line 110, the processor reads the saturating phase counter to obtain a phase count, V. At line 120, the phase count is compared with an upper threshold value, Thresh+. If the phase count exceeds the upper threshold value, then at least the most recently counted early/late signals have been predominantly early signals, driving the phase count above the upper threshold. In that case, the processor increments a phase control variable, PhaseCntrl, as shown at line 130. At line 140, the phase count is compared with a lower threshold value, Thresh−. If the phase count exceeds the lower threshold value (i.e., falls below the lower threshold value), then at least the most recently counted early/late signals have been predominantly late signals, driving the phase count below the lower threshold. In that case, the processor decrements the phase control variable, as shown at line 150. In one embodiment, the phase control variable (which be maintained exclusively in the processor or stored in a processor-accessible memory) includes a filter field formed by least-significant bits and a phase control field formed by most-significant bits (MSBs). The size of the phase control field is chosen to match the size of the phase control value 116 within the phase control register 117 of FIG. 1 (i.e., the phase control field is a processor-maintained image of the phase control value 116), and the size of the filter field is chosen in accordance with the desired phase update time constant and the anticipated number of early/late signals (e.g., a peak number, average number or other statistical or empirical measure) that may be counted between execution of the phase update loop of FIG. 5. By this operation, the increment/decrement operations shown at lines 130 and 150 perform divider-type filtering so that the phase control field is updated only upon overflow or underflow of the filter field. At line 160, the processor writes the phase control field (i.e., the MSBs of the phase control variable) to the phase control register to update the phase control value therein. By this operation, if the filter field has overflowed or underflowed, the resulting increment or decrement to the phase control field will produce a corresponding increment or decrement in the phase control value.

In the exemplary pseudo-code listing of FIG. 5, the actions of the processor are substantially the same in each pass through the phase update loop so that a substantially deterministic time is required to perform each phase update operation. In alternative embodiments, the "If" statement (i.e., conditional operation) at line 140 may be changed to an "Else if" statement, so that the phase count is compared against the lower threshold only if the phase count did not exceed the upper threshold. Similarly, the update operation at line 160 may be executed only if the phase control variable was incremented at line 130 or decremented at line 150. That is, the write to the phase control register may be performed conditionally, depending on whether the phase count exceeded at least one of the upper and lower thresholds. The write to the phase control register may be further limited to only those instances in which an update to the phase control variable yields a change in the phase control field. For example, the phase control field and filter field may be maintained as separate variables to facilitate determination of filter field overflow/underflow, with the phase control field being updated and written to the phase control register only upon such filter field overflow/underflow. In yet other embodiments, an additional "If" statement may be provided to determine if the phase count does not exceed either of the upper/lower thresholds and, in that case, to enable execution of a no-operation instruction (or other instruction) to match or substantially match the time required to execute the increment/decrement operations at lines 130 and 150, thereby providing greater determinism in the phase-update execution time. A similar construct may be used to match the time required to perform a conditional write to the phase control register (i.e., matching the write time for those passes through the loop where no write operation is executed). Also, while a software controlled loop is shown in the pseudo-code listing of FIG. 5 (i.e., Loop, EndLoop), the phase update operation may instead be repeated in response to detection of certain events or conditions (e.g., in response to a processor interrupt or other timing event used to establish even update intervals). Further, although a single phase update operation is shown within the pseudo-code listing of FIG. 5, multiple phase update operations may be carried out in each pass through the loop, with the other phase update operations being applied to other CDR systems within the same or different integrated circuit device (e.g., one update per CDR-based signaling link in the device or system). Also, filtering operations, frequency loop updates and other operations may also be executed by the processor in conjunction with phase update operations.

Figure 6:
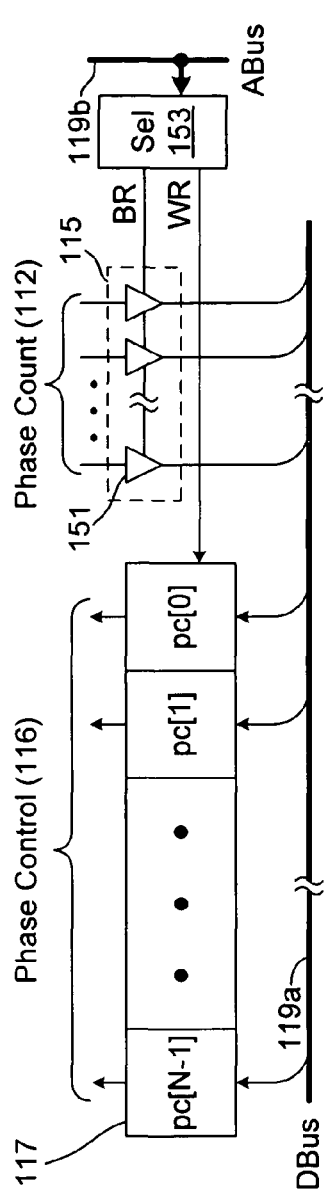
FIG. 6 illustrates exemplary embodiments of the output buffer and phase control register of FIG. 1, together with a selector circuit.

FIG. 6 illustrates exemplary embodiments of the output buffer 115 and phase control register 117 of FIG. 1, together with a selector circuit 153. The selector circuit 153 is coupled to an address bus component 119b (ABus) of the processor bus, and the output buffer 115 and phase control register 117 are coupled to a data bus component 119a (DBus) of the processor bus. During a phase-count read operation, the processor outputs an address that corresponds to the output buffer 115 onto the address bus 119b. The selector circuit 153 includes address decoding logic that responds to the address by asserting a buffer-read signal (BR). The output buffer 115 includes a set of tri-state signal drivers 151 having data inputs coupled to receive respective bits of the phase count 112 (i.e., from phase counter 111 of FIG. 1), data outputs coupled to respective lines of the data bus 119a, and output-enable inputs coupled to receive the buffer-read signal. By this arrangement, when the buffer-read signal is asserted, the output buffer 115 drives the phase count 112 onto the data bus so that it may be received by the processor. When the buffer-read signal is deasserted (i.e., raised or lowered to an inactive logic state), the tri-state signal drivers 151 are placed in a high-impedance state (i.e., tri-stated) so that the data bus 119*a* may be driven by the processor or other agents.

The phase control register 117 includes a plurality of storage elements (e.g., flip-flops, latches or the like) having data inputs coupled to respective lines of the data bus 119*a*, data outputs to supply the phase control value 116 to the interpolator 103 of FIG. 1 (or other clock generating circuitry), and write enable inputs coupled to receive a phase write (PW) signal from the select circuit 153. By this arrangement, when the processor outputs a phase control value on the data bus 119*a* and an address that corresponds to the phase control register 117 on the address bus 119*b*, the select circuit 153 asserts the phase write signal to enable the phase control value to be loaded into the phase control register 117, thereby updating the phase control value therein. In alternative embodiments, the phase control register 117 may be implemented as a counter having count-up and count-down inputs coupled to receive phase-increment and phase-decrement signals, respectively, from the select circuit 153. In such an embodiment, the processor may update the phase control value within the phase control register by outputting either an address that corresponds to the phase-increment signal (i.e., a first address that is decoded by the select circuit 153 to assert the phase-increment signal) or to the phase decrement signal (i.e., a second address that is decoded by the select circuit to assert the phase-decrement signal), thereby effecting a decrement or increment operation within the phase control register.

Still referring to FIG. 6, the addresses output onto the address bus 119*b* may be memory-mapped addresses or input/output-mapped (I/O-mapped) addresses. Also, in an alternative embodiment, a common set of processor bus lines may be used to carry address values and data values at different times (i.e., bus lines shared in a time multiplexed manner).

Figure 7:
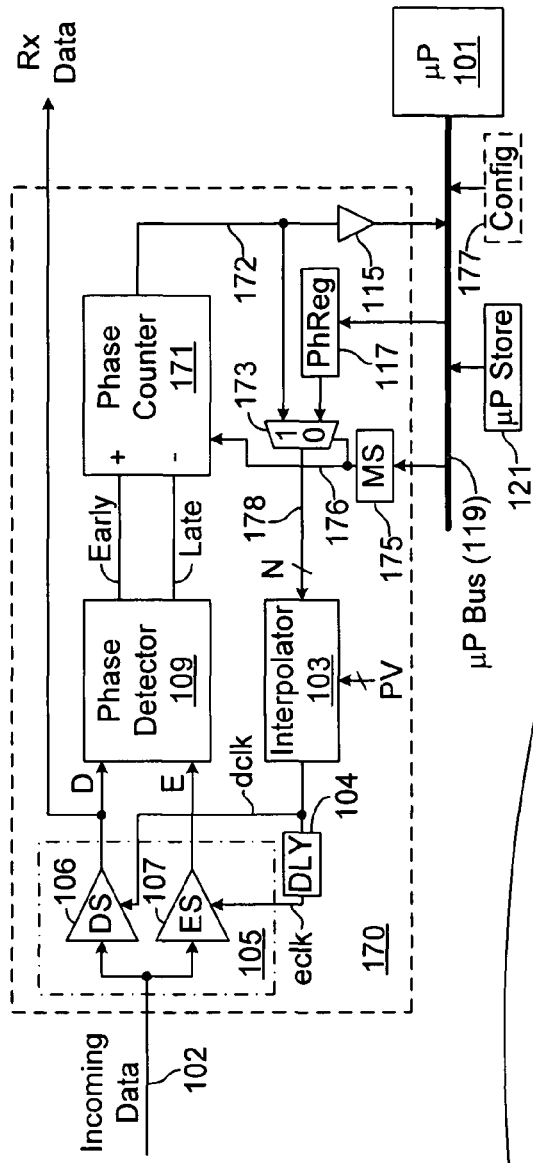
FIG. 7 illustrates a processor-based CDR system according to an alternative embodiment.

FIG. 7 illustrates a processor-based CDR system 170 according to an alternative embodiment. The CDR system 170 includes a phase control register 117, interpolator 103, delay element 104, data-edge sampling circuit 105 and phase detector 109, all of which operate generally as discussed in reference to FIG. 1 to generate a set of sampling clock signals (dclk, eclk), and to output early/late indications to a dual-mode phase counter 171. The dual-mode phase counter 171 operates in either a saturating mode or a modulo-count mode depending on the state of a mode-select value (MS) 176 stored within mode-select storage element 175. The mode-select value 176 is also supplied to the control input of a multiplexer 173 to select either the count value 172 (i.e., a phase count) generated by the dual-mode phase counter or the content of the phase control register 117 to be passed as an N-bit phase control value 178 to the interpolator 103. By this arrangement, when the mode-select value 176 selects a first operating mode, referred to herein as a processor-control mode (e.g., MS=0), the dual-mode phase counter 171 operates in the saturating mode described in reference to FIGS. 1 and 4 (i.e., counting up in response to early signals and down in response to late signals, and saturating at either an upper or lower limit) and the multiplexer 173 passes the content of the phase control register 117 to the interpolator 103. That is, the CDR system operates as described in reference to FIG. 1, with processor 101 reading the saturating output (i.e., phase count) of the phase counter 171 via output buffer 115 and bus 119, then conditionally updating the phase control value within the phase control register 117 according to whether the phase count exceeds an upper or lower threshold. The processor 101 may execute program code stored in program store 121 or an internal storage. Also, an optional configuration circuit 177 (Config) may be provided to control the configuration of the CDR system 170 including, without limitation, the state of the mode-select value 176.

Figure 8:
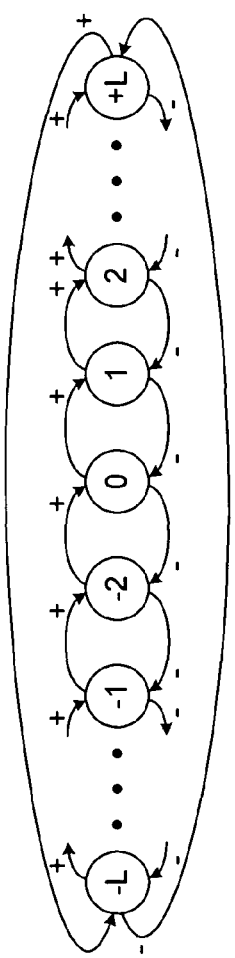
FIG. 8 illustrates an exemplary state diagram of the phase counter of FIG. 7 when operated in a modulo counting mode.

When the mode-select value 176 is in a second state (e.g., MS=1), a processor-bypass mode is selected within the CDR system 170. In processor-bypass mode, the multiplexer 173 passes the N most significant bits of the phase count within the dual-mode phase counter to the interpolator 103 as the N-bit phase control value 178, and the dual-mode phase counter 171 is operated in a modulo counting mode as shown, for example, by the state diagram of FIG. 8. That is, the phase count is incremented up to a maximum value (+L) in response to early signals, then overflows (i.e., rolls over to a minimum value, −L) in response to the next early signal. Conversely, the phase count value is decremented to the minimum value (−L) in response to late signals, then underflows (i.e., rolls over to the maximum value, +L) in response to the next late signal. By this operation, the least significant bits of the phase counter operate as a divider-type filter, incrementing and decrementing the most significant N-bits of the phase count at overflow and underflow, respectively.

In one embodiment, the CDR system 170 of FIG. 7 is switched between processor-control modes and processor-bypass modes depending upon whether the clock used to transmit data signal 102 bears a plesiochronous or mesochronous relationship to the reference clock frequency. In a mesochronous signaling system where a relatively long time-constant update rate is desired, a logic-low mode-select value 176 may be stored within mode-select storage element 175 to select the processor-control mode, thereby enabling the processor 101 to read the dual-mode phase counter (i.e., operating as a saturating counter) at relatively infrequent intervals without rollover-induced loss of phase update information and without requiring a substantial increase in the size of the phase counter 171. In a plesiochronous signaling system where relatively short time-constant update rate is desired to track the phase drift between the transmit clock signal and sampling clock signals, a logic-high mode-select value 176 may be stored within mode-select storage element 175 to select the processor-bypass mode, thereby enabling the phase counter 171 to supply the phase count 172 directly to the interpolator as the N-bit phase control value 178. Thus, the processor-control mode and processor-bypass mode may be viewed as mesochronous and plesiochronous operating modes within the CDR system 170, though the processor-control and processor-bypass modes may be enabled for other purposes in alternative embodiments.

In one embodiment, a mode select value 176 is stored within the mode-select storage element 175 by the processor 101 during system initialization to establish either the processor-control or processor-bypass operating mode for the CDR system 170. The mode-select storage element may be implemented as a standalone storage element as shown in FIG. 7, or as an additional bit of the phase control register (e.g., accessed in response to assertion of the phase write signal) or other configuration circuit. In either case, the mode-select storage element may be accessed in response to either a memory-mapped or input/output-mapped address as described in reference to FIG. 6.

Figures 9, 10:
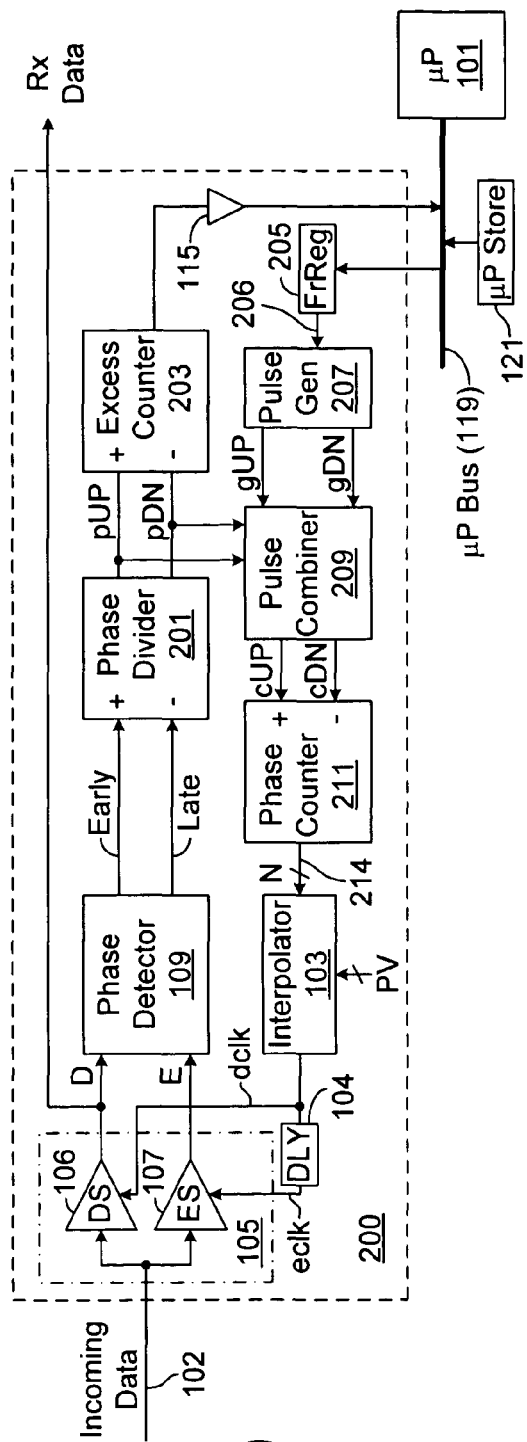
FIG. 9 illustrates an alternative embodiment of a CDR system having processor-based frequency control loop.
FIG. 10 illustrates an exemplary pseudo-code listing that may be executed by a processor to perform frequency update operations in the CDR system of FIG. 9.

FIG. 9 illustrates an alternative embodiment of a CDR system 200 having processor-based frequency control loop. The CDR system 200 includes an interpolator 103, delay element 104, data-edge sampling circuit 105 and phase detector 109, all of which operate generally as discussed in reference to FIG. 1 to generate a set of sampling clock signals (dclk and eclk), and to generate a sequence of early/late indications. As shown, the early/late indications are supplied to count-up and count-down inputs of a phase divider 201. In one embodiment, the phase divider 201 is a modulo counter that implements a divider-type filter; asserting phase-up and phase-down signals (pUP, pDN) upon overflow and underflow, respectively. The phase-up/down signals are supplied to a pulse combiner 209 and also to an excess counter 203. In one embodiment, the excess counter 203 is a saturating counter that operates generally as described in reference to FIG. 4, saturating at an upper or lower limit. The excess counter output is supplied to an output buffer 115 that may be read by a processor 101 via bus 119, for example, as described in reference to FIG. 6. The processor 101 executes a sequence of instructions to conditionally update a frequency difference value 206 within a frequency control register 205. The frequency difference value 206 is output from the frequency control register to a pulse generator 207 which, in response, outputs a periodic (or substantially periodic) sequence of frequency-up signals or frequency-down signals (fUP, fDN) to the pulse combiner 209. The pulse combiner 209 combines the phase-up/dn signals from the phase divider 201 and the frequency-up/down signals from the pulse generator 207 to produce a combined-up signal (cUP) and a combined-down signal (cDN) which are supplied to count-up and count-down inputs, respectively, of a phase counter 211. In one embodiment, the phase counter 211 is an N-bit modulo counter that adjusts a phase count 214 up and down in response to the combined-up/down signals. The phase count 214 is output from the phase counter 211 to the interpolator 103 to control the phase of the sampling clock signals.

In one embodiment, the pulse combiner 209 is a state machine that generates the combined-up and combined-down signals by generating a sum of the count-up signal assertions, pUP and fUP and any buffered count-up signals (bUP), minus count-down signal assertions, pDN and fDN and any buffered count-down signals (bDN). The pulse combiner 209 then asserts the combined-up signal, cUP, if the sum is greater than zero, and asserts the combined-down signal, cDN, if the sum is less than zero. The count of buffered up signals, bUP, is used to keep track of redundant count-up signal assertions (i.e., where both pUP and fUP are asserted in the same update cycle) and is thus incremented if the count of buffered down signals, bDN, is zero and both pUP and fUP are asserted. Similarly, the count of buffered down signals, bDN, is used to keep track of redundant count-down signal assertions and is therefore incremented if bUP is zero and both pDN and fDN are asserted. If the sum is zero and either bUP or bDN is nonzero, then whichever of bUP and bDN is nonzero is decremented (i.e., because either a buffered count-up signal or buffered count-down signal has been applied to cancel a count-down signal or count-up signal, respectively). In alternative embodiments, the pulse combiner 209 may act as an arbiter and ignore up and down signals from the pulse generator 207 when count-up or count down signals are generated by the phase divider 201, or vice-versa. Also, instead of buffering count-up and count-down signals, the pulse combiner 209 may output an increment-by-two signal and decrement-by-two signal to the phase counter 211 (i.e., to cause corresponding +2, −2 increment/decrement operations therein) in response to assertion of both pUP and fUP or both pDN and fDN in a given update cycle.

In one embodiment, the pulse generator 207 generates either up pulses (fUP) or down pulses (fDN) according to the sign of the frequency difference value 206, and at a frequency determined by the magnitude of the frequency difference value 206. FIG. 10 illustrates an exemplary pseudo-code listing that may be executed by a processor to perform frequency update operations in the CDR system 200 of FIG. 9. The pseudo-code listing may be embodied by a sequence of instructions stored together with associated operands and/or data in the program store 121 of FIG. 9. The line numbers shown in connection with individual pseudo-code statements are provided for convenience of reference only and should not be construed as requiring the processor to be programmed in a particular programming language or as having a particular instruction set. Psuedo-code lines 100 and 170 mark the beginning and end of a frequency update instruction sequence that may be repeated indefinitely or exited in response to certain conditions. At line 110, the processor reads the excess counter (i.e., element 203 of FIG. 9) to obtain an excess count, V. At line 120, the excess count is compared with an upper threshold value, Thresh+. If the excess count exceeds the upper threshold value, then at least the most recently counted up/down signals from the phase divider 201 have been predominantly count-up signals, driving the excess count above the upper threshold. In that case, the processor increments a frequency difference variable (FreqDiff), as shown at line 130. At line 140, the excess count is compared with a lower threshold value, Thresh−. If the excess count exceeds the lower threshold value (i.e., falls below the lower threshold value), then at least the most recently counted up/down signals have been predominantly count-down signals, driving the excess count below the lower threshold. In that case, the processor decrements the frequency difference variable as shown at line 150. In one embodiment, the frequency difference variable (which may be maintained exclusively in the processor or stored in a processor-accessible memory) includes a filter field formed by least-significant bits and a frequency control field formed by most-significant bits. The size of the frequency control field is chosen to match the size of the frequency difference value within the phase control register (i.e., the frequency control field is a processor-maintained image of the frequency difference value), and the size of the filter field is chosen in accordance with the desired frequency update time constant and the anticipated, peak number of up/down signals that may be counted between frequency update operations. By this operation, the increment/decrement operations shown at lines 130 and 150 perform divider-type filtering so that the frequency control field is updated only upon overflow or underflow of the filter field.

Still referring to FIG. 10, at line 160, the processor writes the frequency control field (i.e., the MSBs of the frequency difference variable) to the frequency control register (i.e., element 205 of FIG. 9) to update the frequency difference value therein. By this operation, if the filter field has overflowed or underflowed, the resulting increment or decrement to the frequency control field will produce a corresponding increment or decrement in the frequency difference value, thereby establishing an increased or decreased rate of up/down pulse generation in pulse generator 207 of FIG. 9. As in the pseudo-code listing of FIG. 5, the sequence of instructions may be modified to achieve greater determinism, and the frequency update operation shown at 160 may be performed only in response to a change in the frequency control field of the frequency difference variable. Also, while a software controlled loop is shown in FIG. 10 (i.e., Loop, EndLoop), the frequency update operation may instead be repeated in response to detection of certain events or conditions (e.g., in response to a processor interrupt or other timing event used to establish even update intervals). Further, although a single frequency update operation is shown within the loop of FIG. 10, multiple frequency update operations may be carried out in each loop, with the other frequency update operations being applied to other CDR systems within the same or different integrated circuit device (e.g., one update per CDR-based signaling link in the device or system).

FIG. 11 illustrates an exemplary pseudo-code listing that may be executed by a processor to perform both phase and frequency update operations in the CDR systems of FIGS. 1 and 7. As with the pseudo-code listings described above, the pseudo-code listing of FIG. 11 may be embodied by a sequence of instructions stored together with associated operands and/or data in the program store 121 of FIGS. 1 and 7. Also, the line numbers shown in connection with individual pseudo-code statements are provided for convenience of reference only and should not be construed as requiring the processor to be programmed in a particular programming language or as having a particular instruction set. Pseudo-code lines 100 and 170 (Loop, EndLoop) mark the beginning and end of a phase/frequency update loop that may be repeated indefinitely or exited in response to certain conditions. At line 110, the processor reads the saturating phase counter to obtain a phase count, V. At line 120, the phase count is compared with an upper threshold value, Thresh+. If the phase count exceeds the upper threshold value, then at least the most recently counted early/late signals have been predominantly early signals, driving the phase count above the upper threshold. In that case, the processor performs the operations at lines 130-160, starting with incrementing the phase control variable, PhaseCntrl, at line 130. At line 140, a frequency count variable, FreqCnt is evaluated to determine if it has reached a maximum frequency count (FreqCntMax). If so, a frequency difference variable, FreqDiff, is incremented at line 150 to indicate that an increased number of phase increments per unit time (or a reduced number of phase decrements per unit time) are required to compensate for the phase drift between transmit and sampling clock signals in a plesiochronous signaling system. At line 160, the frequency count variable is incremented in modulo fashion, overflowing to a minimum value if at the FreqCntMax value.

At line 170, the phase count is compared with a lower threshold value, Thresh−. If the phase count exceeds the lower threshold value (i.e., falls below the lower threshold value), then at least the most recently counted early/late signals have been predominantly late signals, driving the phase count below the lower threshold. In that case, the processor performs the operations at lines 180-210, starting with decrementing the phase control variable at line 180. At line 190, the frequency count variable is evaluated to determine if it has reached a minimum frequency count (zero in this example). If so, the frequency difference variable is decremented at line 200 to indicate that an increased number of phase decrements per unit time (or a reduced number of phase increments per unit time) are required to compensate for the phase drift between transmit and sampling clock signals. At line 210, the frequency count variable is incremented in modulo fashion, underflowing to a maximum value if at the minimum value.

Reflecting on the application of the frequency count variable at lines 140-150 and 190-200, it can be seen that when the frequency count variable is poised to overflow or underflow, the frequency difference variable is incremented or decremented, respectively. In this regard, the frequency counter variable may be viewed as forming the least significant bits of the frequency difference variable, and thus effecting a divider-type filter. Other filtering techniques may be used in alternative embodiments. Also, while not specifically shown, additional operations may be executed by the processor to prevent the frequency difference variable from overflowing or underflowing.

In one embodiment, the frequency difference variable is a sign-magnitude value in which the magnitude indicates the number of phase steps per unit time required to compensate for phase drift in a plesiochronous system, and the sign indicates whether the phase steps are phase increments or phase decrements. Accordingly, the ratio of the frequency difference variable to the loop invocation rate (i.e., the frequency with which the phase/frequency update loop is executed) represents the number of phase steps to be added or subtracted from the phase control variable in each phase/frequency loop execution in order to compensate for phase drift (i.e., frequency difference in a plesiochronous system). The ratio of the frequency difference variable to the loop invocation rate is illustrated graphically in the phase-time plot of FIG. 12 as the slope of a phase drift curve 235. Thus, in each pass through the phase/frequency update loop of FIG. 11, the slope of the phase drift curve 335, "Slope," is calculated at line 220 by dividing the frequency difference variable by a constant or adaptively generated value, LoopInvocationRate, that corresponds to the execution rate of the phase/frequency loop. In the embodiment of FIG. 11, Slope is assumed to be a floating point variable to accommodate fractional phase increments or decrements per loop invocation. In alternative embodiments, discussed below, a scaling factor may be applied to enable the phase/frequency update to be computed using fixed point variables. At line 230, a variable, Delta, that represents the factional component of Slope that remains after applying any phase update, is summed with the present value of Slope to produce an updated Delta value. At line 240, a Step variable which represents the phase increment or decrement value that will be added to the phase control variable in the current loop execution is initialized to zero. If, at line 250, Delta is determined to be greater than or equal to one, then a phase increment is required to compensate for frequency drift, and Step is assigned a value of one at line 260. Similarly, if Delta is determined to be less than or equal to negative one at line 270, Step is assigned a value of negative one at line 280. At line 290, Delta is updated based on the current value of Step, in effect splitting the value of Delta assigned at line 230 between a new value of Delta (i.e., a new residual, fractional component of Slope) and Step. At line 300 Step is added to the phase control variable and, at line 310, the most significant bits of the phase control variable are written to the phase control register as described in reference to FIG. 5.

FIG. 12 illustrates an exemplary computation of Delta over a sequence of loop invocations ($LI_J$, $LI_{J+1}$, $LI_{J+2}$, $LI_{J+3}$, ...) in which a value of 0.4 is computed for Slope. Thus, assuming that Delta is initially set to zero during loop invocation J, Delta is incremented to 0.4 and then 0.8 during loop invocations J+1 and J+2, respectively. During loop invocation J+3, Delta is incremented to 1.2, a value greater than one. Accordingly, in loop invocation J+3, Step is assigned a value of one (lines 260 of FIG. 11) and Delta is reduced to a value of 0.2 (line 290 of FIG. 11). That is, the initial value computed for Delta, 1.2, is split between a +1 step and a new Delta value of 0.2.

Still referring to FIGS. 11 and 12, the value of Delta may be initialized to zero or any other practical value prior to the first invocation of the phase/frequency update loop. Similarly, the value, LoopInvocationRate may be a constant value determined based on a predetermined execution interval established for the Phase/Frequency update loop (e.g., determined at system production time or during system initialization) or may be initialized to a nominal value and thereafter adaptively updated based on a determination of the actual or average loop invocation frequency (e.g., hardware or software timers may be used to determine the interval between successive invocations). Also, the value of Slope computed at line 220 may be limited or, if determined to exceed a threshold, used to signal an out-of-tolerance error condition. Further, as mentioned above, a scaling factor may be used to avoid the floating point arithmetic at lines 220 and 230. For example, in one embodiment, a constant LoopInvocationRate value is used as a scaling factor to obviate the division at line 220. That is, Slope becomes simply the frequency difference value FreqDiffEst, and therefore may be maintained as a fixed point number. To complete the scaling operation, Delta is compared with ±LoopInvocationRate at lines 250 and 270, respectively, and Delta is updated at line 290 by "Delta=Delta−(LoopInvocationRate×Step)." In alternative embodiments, other scaling factors may be used and other optimizations may be applied to increase the efficiency and/or determinism of the phase/frequency update loop of FIG. 11.

Figure 13:
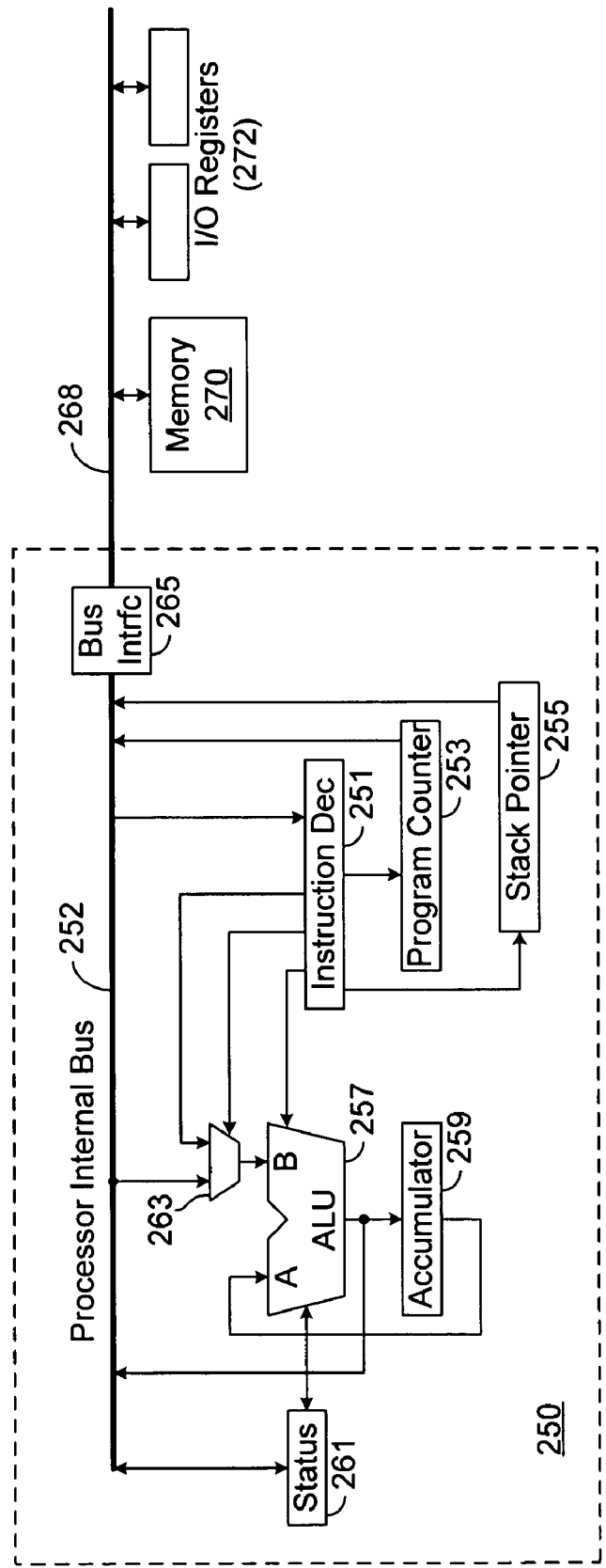
FIG. 13 illustrates an embodiment of a processor that may be used to execute instruction sequences that correspond to the pseudo-code listings of FIGS. 5, 10 and 11.

FIG. 13 illustrates an embodiment of a processor 250 that may be used to execute instruction sequences that correspond to the pseudo-code listings of FIGS. 5, 10 and 11. The processor 250 includes an instruction decoder 251, program counter 253, stack pointer 255, arithmetic-logic unit 257 (ALU), accumulator 259, status register 261, multiplexer 263, internal bus 252 and bus interface 265. During run-time operation, the program counter 253 is stepped through a sequence of addresses, jumping to out-of-sequence addresses in response to jump instructions (or branch instructions or the like) and, in the case of conditional jump instructions, based on contents of the status register 261. During each instruction execution cycle, an instruction is fetched from a location within memory 270 indicated by the program counter 253, and loaded into the instruction register 251. In one embodiment, the internal bus 252 includes separate address and data buses that are used to carry addressing information (e.g., the value of the program counter 253 being supplied to the memory 270 via bus interface 265 and an external bus 268) and data/instructions, respectively. In an alternative embodiment, the internal bus 252 and/or the external bus 268 may be a time multiplexed bus to carry both addresses and data/instructions at different times. In either case, after an instruction has been fetched from memory 270 and loaded into the instruction decoder 251, the instruction is decoded by the instruction decoder 251 and used to control the operations of the ALU 257, multiplexer 263, accumulator 259, program counter 253, stack pointer 255 and bus interface 265. For example, if the instruction indicates a memory read or write operation, memory is read at a location indicated by the instruction (which may reference an index register or other source of indirect address computation, not shown) and stored within the accumulator 259 via multiplexer 263 and ALU 257. If an instruction indicates an arithmetic or logical operation is to be carried out using the content of the accumulator 259, the instruction decoder issues control signals to the ALU 257 to indicate the nature of the operation, and issues control signals to the multiplexer 263 to select the source of a second operand, if any. For example, if the second operand is part of the instruction loaded into the instruction decoder 251, the multiplexer 263 is set to pass the second operand from the instruction decoder to the 'B' input of the ALU 257. If the second operand is being fetched from memory 270 or is sourced by the status register 261 or the ALU 257 itself, the second operand is driven onto the internal bus 252 and passed to the 'B' input of the ALU via multiplexer 263. The content of the accumulator 257 may be supplied to the 'A' input of the ALU 257 so that the specified arithmetic or logical operation may be carried out on the operands supplied to the 'A' and 'B' inputs of the ALU 257, with the result being re-loaded into the accumulator 259 and/or passed to the processor internal bus 252 (e.g., to be written to memory 270, re-circulated to the 'B' input of the ALU 257, or to be loaded into another register within the processor 250). The result of a given logical or arithmetic operation within the ALU 257 may result in one or more flags being set within the status register (e.g., overflow, underflow, zero, error, etc.), with such flags being supplied to other circuit blocks within the processor 270 via the processor internal bus 252 or other signal paths (not shown). For example, the flags may supplied to the instruction decoder 251 to enable the instruction decoder to make conditional jump decisions, in which case, the instruction decoder 251 may signal the program counter to load a new address sourced by the internal bus 252, accumulator 259, ALU 257, or other address source. The stack pointer 255 is provided to keep track of a top-of-stack location within the memory 270 and is decremented and incremented in response to stack push and pop instructions decoded by the instruction decoder 251.

Still referring to FIG. 13, the memory 270 may include multiple different storages including, without limitation, a non-volatile storage to store program code and static data values, and a random-access-memory (RAM) to store program variables and the program stack. Also, the memory 270 or any portion thereof may be included within the processor core in alternative embodiments, rather than being accessed via the external bus 268. Input/output registers 272 (e.g., the registers 117, 205 and output buffer 115 of FIGS. 1, 7, 9) may be memory mapped and therefore accessed via the external bus 268 in response to output of corresponding addresses, or may be input/output mapped, and thus accessed in response to input/output instructions.

It should be noted that while a particular processor architecture has been described, the processor may alternatively be any general purpose or special purpose processor and the particular instructions executed to carry out the operations in the pseudo-code listings in FIGS. 5, 10 and 11 may be compiled and/or translated from human-oriented programming languages (whether procedural, object oriented or any other type of programming language) into machine-readable instructions during system production or during system run-time (e.g., as when an embedded compiler/translator is provided).

Figure 14:
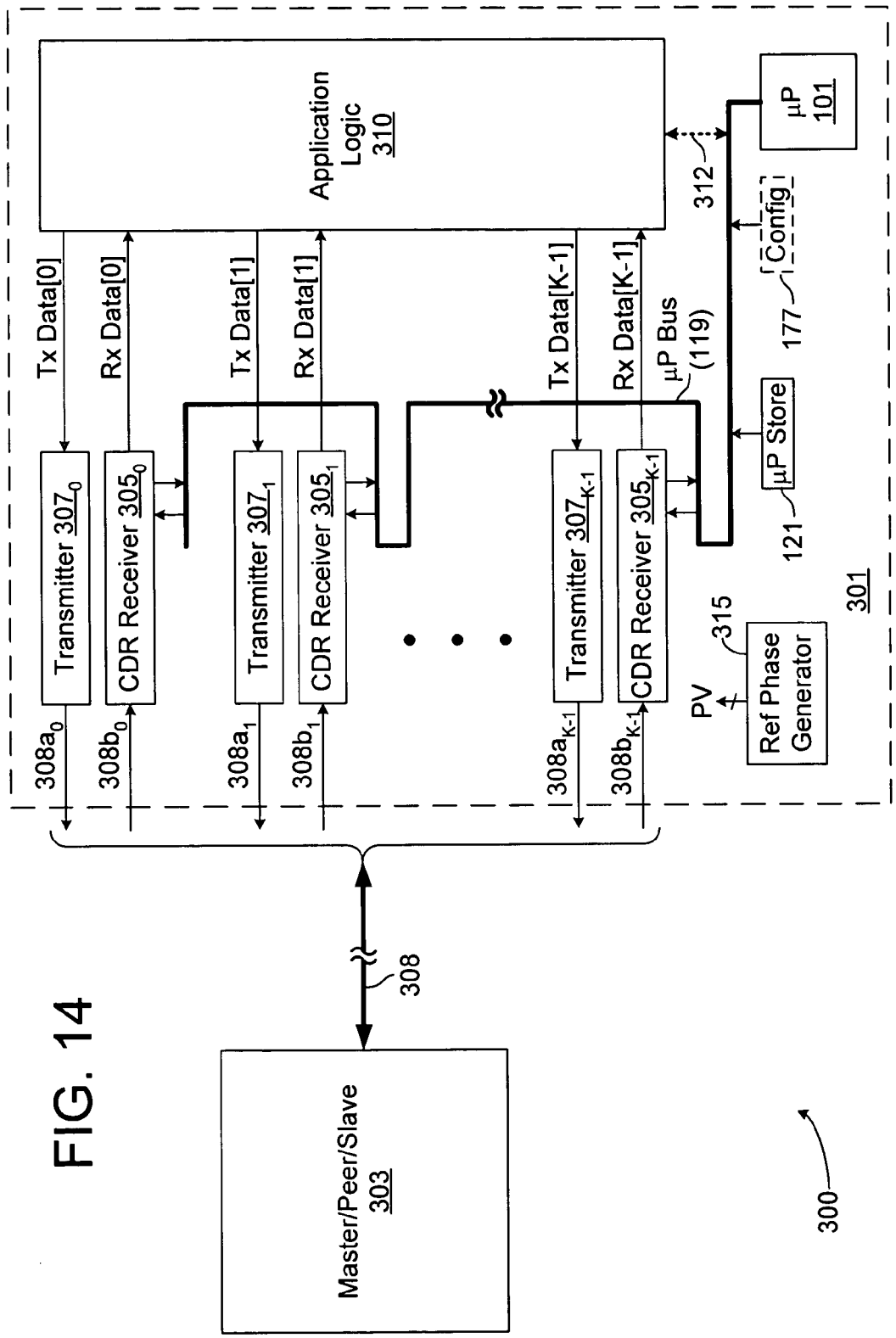
FIG. 14 illustrates a signaling system in which a processor-controlled CDR system according to the embodiments of FIGS. 1-11 may be employed.

FIG. 14 illustrates a signaling system 300 in which a processor-controlled CDR system according to the embodiments of FIGS. 1-11 may be employed. The system 300 may form part of a computing device (e.g., mobile, desktop or larger computer), networking equipment (e.g., switch, router, etc.), consumer electronics device (e.g., telephone, personal digital assistant (PDA), etc.), or any other type of device in which processor-controlled CDR operation is desired.

The system includes an integrated circuit (IC) 301 coupled to at least one other IC 303 via a signal path 308. In the embodiment shown, the signal path 308 is formed by multiple high-speed serial links $308a_0$-$308a_{K-1}$, $308b_0$-$308b_{K-1}$ for conducting serialized transmissions between ICs 301 and IC 303. In alternative embodiments, each of the links or any subset thereof may be bi-directional, and the links, whether bi-directional or unidirectional may be used, collectively, to transmit parallel groups of bits (e.g., each group of bits forming a data and/or control word (e.g., command, address, etc.) or a portion of a data and/or control packet. The ICs 301 and 303 may be peers (e.g., each IC being capable of independently initiating a signal transmission to the other), or master and slave. Also, the relative status of the ICs 301 and 303 may change from time-to-time such that one IC is a master at a first time, then a slave at another time, and/or a peer at another time.

IC 301 is shown in simplified block diagram form and includes application logic 310, processor 101, program store 121 and reference phase generator 315, together with a set of transmitters $307_0$-$307_{K-1}$, and a corresponding set of CDR receivers $305_0$-$305_{K-1}$ (i.e., receivers having a clock-data recovery system therein), with each transmitter 307 and CDR receiver 305 forming a transmitter/receiver pair (i.e., a transceiver) for transmitting and receiving data over corresponding unidirectional (or bidirectional) signaling links 308a and 308b, respectively. In the bidirectional case, each receiver/transmitter pair may share a single bidirectional signaling link. Data recovered by the CDR receivers 305 is passed to the application logic 310 as a set of K receive data values (Rx Data[K−1:0]) and, conversely, the application logic 310 supplies transmit data values, Tx Data[K−1:0] to the transmitters 307. Although a single data bit per receiver/transmitter is depicted in FIG. 14, each transmitter 307 and/or CDR receiver 305 or any subset thereof may alternately receive/supply multiple bits of data from/to the application logic 310 in alternative embodiments, particularly in embodiments which convey multiple data bits per transmitted symbol (e.g., a multi-level signaling embodiment). A processor bus 119 is coupled to each of the CDR receivers $305_0$-$305_{K-1}$ to enable processor access to the phase count value and phase control register therein. By this arrangement, a single processor 101 may perform phase update operations for each of the CDR receivers $305_0$-$305_{K-1}$. For example, in one embodiment, the processor executes a repeating CDR update loop (e.g., embodied by program instructions stored within the program store 121) to perform the phase and/or frequency update operations described in reference to FIGS. 5, 10 and 11 for each of the CDR receivers $305_0$-$305_{K-1}$ in turn. The processor 101 may be programmed to repeat the CDR update loop immediately upon completing the CDR update operation for the final CDR receiver 305 (i.e., CDR receiver $305_{K-1}$) or may await an interrupt or other event used to control the update interval. In one embodiment, ICs 301 and 303 are clocked by different reference clock sources and therefore constitute a plesiochronous signaling system. In an alternative embodiment or alternate operating mode or configuration, the ICs may be clocked by the same reference clock source to provide a mesochronous signaling system. Configuration circuitry located within the application logic and/or coupled to the processor bus (i.e., as shown by configuration element 177) may be run-time or production-time programmed with configuration information that is used to establish either a plesiochronous or mesochronous mode of operation within the CDR receivers as described above in reference to FIGS. 6-8. That is, in the mesochronous mode, the processor may poll the phase count generated within each CDR receiver 305 (or a subset thereof) and write updated phase and/or frequency information to the corresponding control register therein to control the phase and/or frequency of the sampling clock signals. To establish the plesiochronous mode, the processor may write a control bit (or bits) to a select circuit within each CDR receiver 305 (or a subset thereof) to establish a path between the phase counter output and the clock phase interpolator, thereby enabling phase updates to occur without further processor intervention.

The reference phase generator 315 may be, for example, a phase-locked loop, delay-locked loop or any other circuit capable of generating a set of reference phase vectors, PV. The reference phase vectors are supplied to clock phase interpolators (e.g., element 103 of FIGS. 1, 7 and 9) to enable interpolated clock generation as described above. The reference phase generator 315 may be clocked by an on-chip reference clock source or may receive a reference clock signal from an off-chip source. Also, a single reference phase generator 315 may supply a common set of reference phase vectors to all the CDR receivers 3050-305K−1 or, alternatively, multiple reference phase generators 315 may be provided to supply distinct sets of reference phase vectors to individual CDR receivers 305 or subsets of CDR receivers 305. In one embodiment, the reference phase generator 315 generates phase vectors having a predetermined reference frequency. Alternatively, the application logic 310 may be programmed or otherwise determine a desired reference frequency (e.g., by negotiating with the IC 303 to determine an expected signaling rate) and configure the reference phase generator accordingly to generate phase vectors having the desired reference frequency.

The clock generating circuitry within the CDR receivers 305 may each output one or more transmit clock signals to the counterpart transmitter 307 to time data transmission operations therein. The transmit clock signals may be free running clock signals, for example, generated by a VCO within a clock generator of the CDR receivers 305, or may be phase aligned with one or more of the sampling clock signals used to sample the incoming data stream.

In one embodiment, the application logic 310 includes a circuitry for run-time loading the program store 121 (e.g., via a connection 312 to the processor bus 119), thereby enabling the program store to be loaded with program code at start-up time or thereafter, thus programming the processor 101 according to application needs. As discussed above, such program code may include one or more sequences of instructions and/or data that cause the processor to carry out various clock control operations (e.g., phase update, frequency update), filtering operations (e.g., the above-described divider-type filter operation, finite-impulse-response (FIR) filters, etc.) or any other operations that may be desired within IC 301, including operations unrelated to clock recovery. For example, the sequences of instructions may program the processor 101 to detect certain operating conditions within the application logic or elsewhere within the host system and refrain from updating control registers within the CDR receivers temporarily or until conditions change. At system power up the IC 301 may default to a predetermined configuration settings, including predetermined program code settings, to enable reliable receipt of programming information or other configuration information. Alternatively, out of band signaling (e.g., by a separate path or protocol) may be used to communicate such programming and/or configuration information to the IC 301.

Although separate ICs 301 and 303 are shown in FIG. 14, the circuits within each of the ICs may alternatively be implemented in a single IC (e.g., in a system-on-chip or similar construct), with signal paths $308_0$-$308_{K-1}$ or any subset thereof being routed via one or more metal layers or other signal conducting structures fabricated within the IC. Also, if distinct ICs are provided as shown in FIG. 14, the ICs may be packaged in separate IC packages (e.g., plastic or ceramic encapsulation, bare die package, etc.) or in a single IC package (e.g., multi-chip module, paper thin package (PTP), etc.).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Although the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense. In the event that provisions of any document incorporated by reference herein are determined to contradict or otherwise be inconsistent with like or related provisions herein, the provisions herein shall control at least for purposes of construing the appended claims.

What is claimed is:

1. In a signaling system for transmitting data between a master integrated circuit (IC) device and a slave IC device in which the master and slave IC devices are clocked by reference clocks of the same frequency but arbitrary phase, a method of accounting for drift between the reference clock of the slave device and the reference clock of the master device, the method comprising:
    performing a digital phase comparison in which the reference clock of the slave device is determined to have a first state or a second state according to whether a first clock signal leads or lags transitions of a data signal; and
    generating a difference value in response to plural of the digital phase comparisons that indicates a difference between a number of phase error signals having the first state and a number of the phase error signals having the second state;
    transferring the difference value to a processor in response to at least one enable signal from the processor, the processor including circuitry to fetch programming instructions from program memory and to execute the programming instructions to determine whether the difference value exceeds a first threshold; and
    outputting an updated phase control value from the processor to adjust the phase of the first clock signal if the difference value exceeds the first threshold;
    wherein the processor adjusts the phase of the first clock signal at a rate that is slower than a bitrate represented by the data signal.

2. The method of claim 1 wherein performing a digital phase comparison in which the reference clock of the slave device is determined to have a first state or a second state comprises:
    generating samples of the data signal in response to transitions of sampling clock signals; and
    comparing the samples to generate the phase error signals.

3. The method of claim 2 wherein the sampling clock signals comprise the first clock signal and a data clock signal, and wherein the first clock signal is an edge clock signal.

4. The method of claim 3 wherein generating samples of the data signal comprises generating data samples in response to transitions of the data clock signal and edge samples in response to transitions of the edge clock signal.

5. The method of claim 3 wherein comparing the samples to generate the phase error signals comprises:
    comparing an edge sample captured in response to a transition of the edge clock signal with a data sample captured in response to a subsequent transition of the data clock signal; and
    outputting a phase error signal having the first state if the edge sample and data sample are different.

6. The method of claim 3 wherein comparing the samples to generate the phase error signals comprises:
    comparing a data sample captured in response to a transition of the data clock signal with an edge sample captured in response to a subsequent transition of the edge clock signal; and
    outputting a phase error signal having the second state if the data sample and edge sample are different.

7. The method of claim 1 wherein generating the difference value comprises incrementing a count value in response to the phase error signals having the first state and decrementing the count value in response to the phase error signals having the second state.

8. The method of claim 7 wherein incrementing the count value in response to the phase error signals having the first state comprises adding a positive value to the count value in response to each of the phase error signals having the first state.

9. The method of claim 7 wherein transferring the difference value to a processor comprises transferring the count value to the processor.

10. The method of claim 7 wherein generating the difference value further comprises refraining from incrementing the count value in response to the phase error signals having the first state if the count value has reached a first limit.

11. The method of claim 1 wherein transferring the difference value to a processor in response to at least one enable signal from the processor comprises outputting the difference value onto a bus that is coupled to the processor.

12. The method of claim 1 wherein transferring the difference value to a processor in response to at least one enable signal from the processor comprises:
    executing a read instruction within the processor, including asserting the at least one enable signal indicated by an address associated with the read instruction; and
    outputting the difference value to the processor in response to assertion of the at least one enable signal.

13. The method of claim 1 wherein executing the programming instructions within the processor to determine whether the difference value exceeds a threshold comprises executing a compare instruction within the processor to compare the difference value against the first threshold.

14. The method of claim 1 wherein outputting an updated phase control value from the processor comprises outputting the updated phase control value from the processor to a phase control register.

15. The method of claim 14 wherein outputting an updated phase control value further comprises generating the updated phase control value within the processor by changing a previously generated phase control value if the difference value exceeds the first threshold.

16. The method of claim 1 further comprising:
executing the programming instructions within the processor to determine whether the difference value falls below a second threshold; and
adjusting the phase of the first clock signal if the difference value falls below the second threshold.

17. An integrated circuit device for communicating with a second integrated circuit device, the integrated circuit devices being clocked by reference clocks having the same frequency but arbitrary phase, the integrated circuit device comprising:
a digital phase comparison circuit to determine whether the reference clock has a first state or a second state according to whether a first clock signal leads or lags transitions of a data signal;
a difference generating circuit to generate a difference value in response to the digital phase comparison circuit and to transfer the difference value to a processor in response to at least one enable signal from the processor, wherein the difference value indicates a difference between a number of phase error signals having the first state and a number of the phase error signals having the second state;
a storage circuit to store programming instructions; and
the processor, including circuitry to fetch the programming instructions from the storage circuit, coupled to receive the difference value from the difference generating circuit, the processor being programmed to execute the programming instructions to determine whether the difference value exceeds a first threshold and to update a phase control value to adjust the phase of the first clock signal if the difference value exceeds the first threshold;
wherein the processor adjusts the phase of the first clock signal at a rate that is slower than a bitrate represented by the data signal.

18. The integrated circuit device of claim 17 further comprising a sampling circuit to generate samples of the data signal in response to transitions of sampling clock signals, and wherein the digital phase comparison circuit comprises compare circuitry to compare the samples to generate the phase error signals.

19. The integrated circuit device of claim 18 wherein the sampling clock signals comprise the first clock signal and a data clock signal, and wherein the first clock signal is an edge clock signal.

20. The integrated circuit device of claim 18 wherein the compare circuitry comprises a first compare circuit to compare an edge sample captured in response to a transition of the edge clock signal with a data sample captured in response to a subsequent transition of the data clock signal, the compare circuit being configured to output a phase error signal having the first state if the edge sample and data sample are different.

21. The integrated circuit device of claim 20 wherein the first compare circuit comprises an exclusive-OR circuit.

22. The integrated circuit device of claim 18 wherein the compare circuitry comprises a compare circuit to compare a data sample captured in response to a transition of the data clock signal with an edge sample captured in response to a subsequent transition of the edge clock signal, the compare circuit being configured to output a phase error signal having the second state if the edge sample and data sample are different.

23. The integrated circuit device of claim 17 wherein the difference generating circuit comprises a counter circuit to increment the difference value in response to the phase error signals having the first state and to decrement the difference value in response to the phase error signals having the second state.

24. The integrated circuit device of claim 23 wherein the counter circuit is a saturating counter circuit.

25. The integrated circuit device of claim 17 further comprising:
a phase control circuit to store the phase control value; and
a clock generating circuit coupled to receive the phase control value from the phase control circuit and configured to generate the first clock signal with a phase indicated by the phase control value.

26. The integrated circuit device of claim 25 wherein the processor is programmed to execute the programming instructions to update the phase control value by updating a phase control variable within the processor and overwriting a phase control value stored in the phase control circuit with the phase control variable.

27. The integrated circuit device of claim 25 wherein the processor is programmed to execute the programming instructions to update the phase control value by outputting at least one signal to the phase control circuit to incrementally adjust the phase control value.

28. The integrated circuit device of claim 17 wherein the programming instructions comprise:
an instruction to read the difference value from an address that corresponds to the difference generating circuit;
an instruction to compare the difference value with the first threshold; and
an instruction to adjust a phase control value.

29. The integrated circuit device of claim 28 further comprising a phase control register, and wherein the programming instructions further comprise an instruction to output the phase control value to the phase control register.

30. The integrated circuit device of claim 29 further comprising a clock generating circuit coupled to receive the phase control value from the phase control register and configured to generate the first clock signal with a phase indicated by the phase control value.

31. The integrated circuit device of claim 30 wherein the clock generating circuit comprises:
a reference clock generator to generate a plurality of reference phase vectors; and
an interpolator coupled to receive the plurality of reference phase vectors from the reference clock generator and coupled to receive the phase control value from the phase control register, the interpolator being configured to generate the first clock signal by interpolating between a selected pair of the reference phase vectors to in accordance with the phase control value.

32. The integrated circuit device of claim 29 further comprising a bus coupled to the processor, the phase control register and the difference generating circuit, the processor being configured to receive the difference value from the difference generating circuit via the bus, and configured to output the phase control value to the phase control register via the bus.

33. The integrated circuit device of claim 28 further comprising a phase counter to store the phase control value, the phase counter being configured to adjust the phase control value in response to a phase adjust signal, and wherein the instruction to adjust the phase control value comprises an instruction to generate the phase adjust signal in either a first state or a second state.

34. An integrated circuit device for communicating with a second integrated circuit device, the integrated circuit devices being clocked by reference clocks having the same frequency but arbitrary phase, the integrated circuit device comprising:
means for determining whether the reference clock has a first state or a second state according to whether a first clock signal leads or lags transitions of a data signal;
means for generating a difference value that indicates a difference between a number of phase error signals having the first state and a number of the phase error signals having the second state;
means for transferring the difference value to a processor in response to at least one enable signal from the processor, the processor including circuitry to fetch programming instructions from program memory and to execute the programming instructions to determine whether the difference value exceeds a first threshold; and
means for outputting an updated phase control value from the processor to adjust the phase of the first clock signal if the difference value exceeds the first threshold;
wherein the processor adjusts the phase of the first clock signal using a drift correction at a rate that is slower than a bitrate represented by the data signal.

35. A nontransitory computer-readable media having information embodied therein that includes a description of at least a portion of an integrated circuit device for communicating with a second integrated circuit device, the integrated circuit devices being clocked by reference clocks having the same frequency but arbitrary phase, the information including descriptions of:
a digital phase comparison circuit to determine whether the reference clock has a first state or a second state according to whether a first clock signal leads or lags transitions of a data signal;
a difference generating circuit to generate a difference value in response to the digital phase comparison circuit and to transfer the difference value to a processor in response to at least one enable signal from the processor, the difference value indicating a difference between a number of phase error signals having the first state and a number of phase error signals having the second state;
a storage circuit to store programming instructions; and
the processor, with circuitry to fetch the programming instructions from program memory, coupled to receive the difference value from the difference generating circuit, the processor being programmed to execute the programming instructions to determine whether the difference value exceeds a first threshold and to output an updated phase control value to adjust the phase of the first clock signal if the difference value exceeds the first threshold;
wherein the processor adjusts the phase of the first clock signal at a rate that is slower than a bitrate represented by the data signal.

36. A method of operation within a clock-data recovery (CDR) system that includes a plurality of CDR receivers to receive a plurality of streams of data signals in parallel, the plurality of streams of data signals being free to be different from one another, the method comprising:
sampling the plurality of streams of data signals over a corresponding plurality of signaling links in response to respective stream of clock signals to generate a plurality of sets of samples of the data signals;
generating a plurality of sets of phase error signals, each set of phase error signals having a first state or a second state according to whether a data signal leads or lags transition of the respective clock signal;
generating a plurality of difference values, each difference value indicating a difference between a number of the phase error signals having the first state and a number of the phase errors signals having the second state in the respective set of phase error signals;
transferring the plurality of difference values to a processor;
executing instructions within the processor to determine, for each of the plurality of difference values, whether the difference value exceeds a first threshold; and
adjusting the phase of each of the plurality of streams of clock signals that corresponds to a difference value exceeding the first threshold, each phase being adjusted by the processor at a rate that is slower than a bitrate represented by the data signals.

37. The method of claim 36 wherein the clock signals comprise a plurality of streams of data clock signals and a plurality of streams of edge clock signals, wherein the edge clock signals of each of the plurality of streams of edge clock signals are offset in phase in comparison to the data signals of the respective stream of data signals by a phase offset.

38. The method of claim 37 wherein sampling the plurality of streams of data signals in response to respective clock signals to generate a plurality of sets of samples of the data signals comprises generating data samples in response to respective data clock signals and generating edge samples in response to respective edge clock signals.

39. The method of claim 36 wherein transferring the plurality of difference values to a processor comprises outputting the plurality of difference values onto a bus coupled to the processor.

40. The method of claim 36 wherein adjusting the phase of each of the plurality of streams of clock signals that corresponds to a difference value exceeding the first threshold comprises outputting, for the each of the plurality of streams of clock signals, an updated phase control value from the processor to a corresponding one of a plurality of phase control registers.

41. The method of claim 36 wherein adjusting the phase of each of the plurality of streams of clock signals comprises adjusting the phase of each of the plurality of streams of clock signals in turn.

42. An integrated circuit device comprising:
a plurality of phase detecting circuits to receive a plurality of streams of data signals in parallel over a corresponding plurality of signaling links, the plurality of streams of data signals being free to be different from one another, the plurality of phase detecting circuits to generate a plurality of sets of phase error signals, each error signal of each respective set of phase error signals having a first state or a second state according to whether the corresponding data signal leads or lags the respective clock signal;
a plurality of difference generating circuits to generate a plurality of difference values, each of the difference values indicating a difference between a number of the phase error signals having the first state and a number of the phase error signals having the second state in each respective set of phase error signals; and
a processor coupled to receive the plurality of difference values from the plurality of difference generating circuits, the processor being programmed to determine if each of the difference values exceeds a first threshold and to adjust a phase of each of the clock signals corresponding to a difference value exceeding the first threshold, the phase adjusted at a rate that is slower than a bitrate represented by the data signals.

43. The integrated circuit device of claim 42 further comprising a plurality of sampling circuits to generate a plurality sets of samples of data signals, wherein the plurality sets of samples of data signals comprise of data samples in response to transitions of respective data clock signals and edge samples in response to transitions of respective edge clock signals.

44. The integrated circuit device of claim 42 wherein the plurality of phase detecting circuits comprise compare circuits to compare the plurality of sets of data samples and the respective plurality sets of edge samples to generate the plurality sets of phase error signals.

45. A method of operation within a clock-data recovery (CDR) system, the method comprising:
pre-setting a mode select value to select either processor-control mode or processor-bypass mode;
generating phase error signals having a first state or a second state according to whether a first clock signal leads or lags transitions of a data signal;
generating a difference value that indicates a difference between a number of the phase error signals having the first state and a number of the phase error signals having the second state;
if the processor-control mode is selected, transferring the difference value to a processor in response to at least one enable signal from the processor, wherein the processor compares the difference value with a first threshold and updates a phase control value to adjust the phase of the first clock signal if the difference value exceeds the first threshold; and
if the processor-bypass mode is selected, transferring the difference value to a phase interpolator to adjust the phase of the first clock signal.

46. An integrated circuit device comprising:
a mode-select storage element to store a mode-select value, the mode-select value indicating either a processor-control mode or a processor-bypass mode;
a phase detecting circuit to generate phase error signals having a first state or a second state according to whether a first clock signal leads or lags transitions of a data signal;
a dual-mode phase counter operating in either a saturating mode or a modulo-count mode depending on whether the mode-select value indicates the processor-control mode or the processor-bypass mode, respectively;
wherein the dual-mode phase counter operating in the saturating mode generates a difference value that indicates a difference between a number of the phase error signals having the first state and a number of the phase error signals having the second state, and transfers the difference value to a processor in response to at least one enable signal from the processor, wherein the processor compares the difference value with a first threshold and updates a phase control value to adjust the phase of the first clock signal if the difference value exceeds the first threshold;
wherein the dual-mode phase counter operating in the modulo-count mode transfers a number of most significant bits of a phase count within the dual-mode phase counter to a phase interpolator to adjust the phase of the first clock signal.

* * * * *